(12) United States Patent
Li et al.

(10) Patent No.: US 8,840,726 B2
(45) Date of Patent: Sep. 23, 2014

(54) APPARATUS FOR THIN-FILM DEPOSITION

(75) Inventors: Zilan Li, Singapore (SG); Teng Hock Kuah, Singapore (SG); Jiapei Ding, Singapore (SG); Ravindra Raghavendra, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 647 days.

(21) Appl. No.: 13/155,529

(22) Filed: Jun. 8, 2011

(65) Prior Publication Data

US 2012/0312231 A1 Dec. 13, 2012

(51) Int. Cl.
| | |
|---|---|
| *C23C 16/455* | (2006.01) |
| *C23C 16/458* | (2006.01) |
| *C23F 1/00* | (2006.01) |
| *H01L 21/306* | (2006.01) |
| *C23C 16/30* | (2006.01) |
| *C23C 16/06* | (2006.01) |
| *C23C 16/22* | (2006.01) |

(52) U.S. Cl.
CPC ......... *C23C 16/303* (2013.01); *C23C 16/45563* (2013.01); *C23C 16/45589* (2013.01)
USPC ........... 118/715; 118/728; 118/729; 118/730; 156/345.33; 156/345.34; 156/345.51; 156/345.54; 156/345.55

(58) Field of Classification Search
USPC ........ 118/728, 729, 730; 156/345.33, 345.34, 156/345.51, 345.54, 345.55
See application file for complete search history.

(56) References Cited

U.S. PATENT DOCUMENTS

| | | | | | |
|---|---|---|---|---|---|
| 5,281,274 | A | * | 1/1994 | Yoder | 118/697 |
| 6,634,314 | B2 | * | 10/2003 | Hwang et al. | 118/723 R |
| 6,656,284 | B1 | * | 12/2003 | Hwang et al. | 118/715 |
| 6,812,157 | B1 | * | 11/2004 | Gadgil | 438/763 |
| 6,872,421 | B2 | * | 3/2005 | Hwang et al. | 427/248.1 |
| 8,092,598 | B2 | * | 1/2012 | Baek et al. | 118/715 |
| 8,394,201 | B2 | * | 3/2013 | Kim et al. | 118/715 |
| 8,546,270 | B2 | * | 10/2013 | Kim et al. | 438/758 |
| 2002/0043216 | A1 | * | 4/2002 | Hwang et al. | 118/723 VE |
| 2003/0044533 | A1 | * | 3/2003 | Lee | 427/255.28 |
| 2004/0035362 | A1 | * | 2/2004 | Hwang et al. | 118/719 |
| 2004/0082171 | A1 | * | 4/2004 | Shin et al. | 438/689 |
| 2007/0095286 | A1 | * | 5/2007 | Baek et al. | 118/719 |
| 2009/0032188 | A1 | * | 2/2009 | Tsuchiya et al. | 156/345.23 |
| 2011/0039026 | A1 | * | 2/2011 | Kato et al. | 427/255.26 |
| 2012/0312231 | A1 | * | 12/2012 | Li et al. | 118/715 |

* cited by examiner

*Primary Examiner* — Rudy Zervigon
(74) *Attorney, Agent, or Firm* — Ostrolenk Faber LLP

(57) ABSTRACT

An apparatus 101 for depositing a thin-film onto a surface of a substrate 113 using precursor gases G1, G2 is disclosed. The apparatus 101 comprises i) a supporting device 111 for holding the substrate 113; and ii) a spinner 105 positioned adjacent to the supporting device 111. Specifically, the spinner 105 includes a hub 106 for connecting to a motor, and one or more blades 201 connected to the hub 106. In particular, the one or more blades 201 are operative to rotate around the hub 106 on a plane to drive a fluid flow of the precursor gases G1, G2, so as to distribute the precursor gases G1, G2 across the surface of the substrate 113.

14 Claims, 14 Drawing Sheets

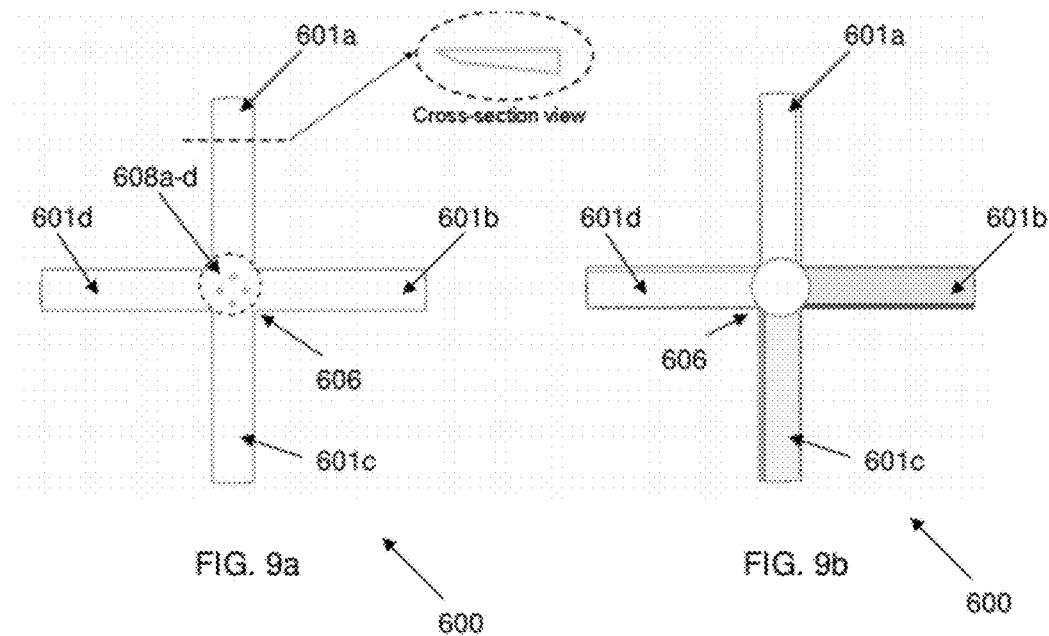

APPARATUS FOR THIN-FILM DEPOSITION

FIELD OF THIS INVENTION

The present invention relates to an apparatus for thin-film deposition, in which precursor gases are introduced into the apparatus to deposit a thin film onto a surface of a substrate.

BACKGROUND OF THE INVENTION

Thin-film deposition techniques are generally used to deposit a semiconductor material onto a substrate for manufacturing integrated circuit devices or optoelectronic devices. For instance, MOCVD is a method of depositing a semiconductor material such as gallium nitride (GaN) on a substrate. The MOCVD method is performed in a reactor with a temperature-controlled environment to activate the deposition of precursor gases on a heated substrate arranged in the reactor whilst reducing the parasitic deposition of the precursor gases on unwanted areas such as on the chamber walls, which are cooler. A first precursor gas includes a Group III element such as gallium (Ga), while a second precursor gas includes a Group V element such as nitrogen (N). These precursor gases are introduced into the reactor to deposit a compound semiconductor such as GaN on a planar surface of the heated substrate. Purging gases such as nitrogen ($N_2$) and hydrogen ($H_2$) are also introduced into the reactor to minimise the deposition of the precursor gases on the unwanted areas within the reactor. Carrier gases such as $N_2$ and $H_2$ are used during the MOCVD operation to move the precursor gases towards the heated substrate.

Typically, the precursor gases are introduced into the reactor in a direction perpendicular or parallel to the planar surface of the heated substrate. In order to ensure that the precursor gases chemically react on the major planar surface of the heated substrate to form the compound semiconductor, these precursor gases have to be close to each other on top of the substrate surface. One problem that arises when the precursor gases are close to each other when they are introduced into the reactor is that an undesirable mutual gas phase reaction takes place which compromises the efficiency of the precursors and consequently the quality of the compound semiconductor deposited on the substrate.

Thus, it is an object of this invention to address the limitation associated with the conventional way of introducing precursor gases into a reactor among thin-film deposition techniques, and particularly among chemical vapour deposition (CVD) techniques.

SUMMARY OF THE INVENTION

A first aspect of this invention is an apparatus for depositing a thin film onto a surface of a substrate using precursor gases. The apparatus comprises: i) a supporting device configured to hold the substrate; and ii) a spinner positioned adjacent to the supporting device. Specifically, the spinner has a hub for connecting to a motor, and one or more blades connected to the hub. In particular, the one or more blades are operative to rotate around the hub on a plane to drive a fluid flow of the precursor gases, so as to distribute the precursor gases across the surface of the substrate.

By providing that the spinner has one or more blades that are operative to rotate around the hub, a uniform distribution of the precursor gases can be provided across the substrate surface. Otherwise, the distribution of the precursor gases may be localized at particular regions on the substrate surface. Advantageously therefore, embodiments of the first aspect of the invention may ensure a reasonably high quality of the thin film as deposited on the surface of the substrate.

Some optional features of the invention are defined below. For example, the blade of the spinner may have a drive face inclined at an oblique angle to the plane for driving the distribution of the precursor gases across the surface of the substrate. This may assist in speeding up the deposition process.

In addition, the hub of the spinner may include a hub inlet through which one of the precursor gases is introduced into an interior of the hub, and each of the one or more blades may also have a blade outlet through which the precursor gas is dispensed from an interior of the respective blade, wherein the interiors of the hub and the blade are in mutual fluid communication. In this way, the spinner may further act as a gas distributor to direct the precursor gas to the substrate surface.

Optionally, each of the one or more blades is an airfoil to generate an additional force to drive the precursor gases towards the substrate surface.

A second aspect of the invention is an apparatus for depositing a thin-film onto a surface of a substrate using precursor gases. Specifically, the apparatus comprises: i) a supporting device configured to support the substrate; ii) a plurality of sets of gas supplies, each set of the gas supplies being configured to supply precursor gases; and iii) a gas distributor configured to direct the precursor gases to the surface of the substrate. Specifically, the gas distributor has a plurality of sets of compartments, each set of compartments being configured to receive the precursor gases from the respective set of gas supplies, and each compartment having apertures through which the received precursor gases flow from the gas distributor towards the supporting device. In particular, the plurality of sets of gas supplies are operative to supply at least one of the precursor gases at controllable flow rates. Further, the apertures at each compartment of the gas distributor are evenly distributed. One of the sets of compartments has a larger volume at the centre of the gas distributor, and a smaller volume at the edge of the gas distributor, compared with the respective other set of compartments. By controlling the relative gas flow ratio between the first and second sets of compartments, uniformity of the thickness of the deposited thin film can be tuned and improved.

A third aspect of the invention is an apparatus is similar to the second aspect of the invention. By contrast, however, the plurality of sets of compartments of the gas distributor have a same volume. One of the sets of compartments has more apertures at the centre of the gas distributor, and fewer apertures at the edge of the gas distributor, compared with the respective other set of compartments. By controlling the relative gas flow ratio between the first and second set of compartments, uniformity of the thickness of the deposited thin film can be tuned and improved.

By improving the uniformity of the thickness of the thin film as deposited on the substrate, embodiments of the second aspect of the invention may ensure a reasonably high quality of the thin film as deposited on the substrate surface.

BRIEF DESCRIPTION OF THE DRAWINGS

Embodiments of the invention will now be described, by way of example only, with reference to the drawings in which:

FIG. 9a and FIG. 9b are respective top and bottom views of the spinner of FIG. 8;

DETAILED DESCRIPTION OF THE PREFERRED EMBODIMENTS

Figure 1:
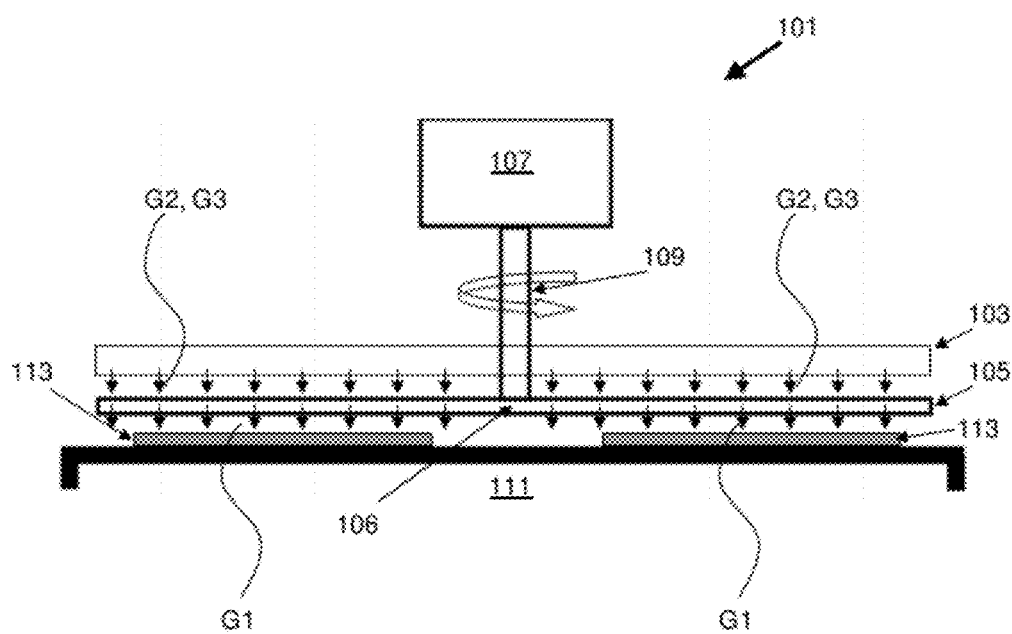
FIG. 1 shows an MOCVD reactor having a gas distributor and a spinner according to its first embodiment of the invention.

FIG. 1 shows an MOCVD reactor 101 having a gas distributor 103 that is connected to one or more gas supplies, a spinner 105 according to a first embodiment for introducing one or more gases into the MOCVD reactor 101, a gas inlet 107 that is connected to one or more gas supplies, a feedthrough 109 that connects the gas inlet 107 to the spinner 105, and a susceptor 111 on which substrates 113 are placed.

Specifically, the feedthrough 109 is connected to a hub 106 of the spinner 105. Various channels providing mutual fluid communication are also included within the spinner 105, the gas inlet 107, and the feedthrough 109, so that gases can flow from the gas inlet 107 through the feedthrough 109 to the spinner 105, and subsequently from the spinner 105 into the MOCVD reactor 101. The gas inlet 107 also includes a motor for driving the feedthrough 109. When the motor is operated to drive the feedthrough 109, the feedthrough 109 in turn drives the hub 106 of the spinner 105 to rotate the spinner 105.

During operation of the MOCVD reactor 101, the substrates 113 are heated by a heater and rotate along with the susceptor 111. A first precursor gas G1 is introduced into the MOCVD reactor 101 via the spinner 105, while a second precursor gas G2 and purging gases G3 are introduced via the gas distributor 103. In particular, the precursor gases G1, G2 and the purging gases G3 are introduced into the MOCVD reactor 101 in a downward direction generally perpendicular to planar surfaces of the substrates 113.

The first precursor gas G1 is an organometallic gas comprising a Group III element such as gallium (Ga). Examples of the first precursor gas G1 are trimethylgallium (TMG), trimethylindium (TMI), trimethyaluminium (TMA) and their mixture. The second precursor gas G2 is an organometallic gas comprising a Group V element such as nitrogen (N). An example of the second precursor gas G2 is ammonia gas ($NH_3$). The purging gases G3 assist the first and second precursor gases G1, G2 to move towards the substrates 113 that are placed on the susceptor 111. The purging gases G3 also assist in expelling the precursor gases G1, G2 from the interior of the MOCVD reactor 101 to minimise contamination of its internal walls. Examples of the purging gases G3 include nitrogen gas ($N_2$) and hydrogen gas ($H_2$). It should be appreciated that the purging gases G3 may also be carrier gases for transporting the precursor gases G1, G2 to the major planar surfaces of the substrates 113.

The spinner 105 is rotated during the operation of the MOCVD reactor 101. The rotation of the spinner 105 accordingly changes the direction in which the precursor gases G1, G2 and the purging gases G3 proceed towards the planar surfaces of the substrates 113, from the original downward direction generally perpendicular to the planar surfaces of the substrates 113 to a direction that is generally parallel to the planar surfaces of the substrates 113. The rotation of the spinner 105 thus provides a uniform distribution of the precursor gases G1, G2 across the planar surfaces of the substrates 113. Without the rotation of the spinner 105, the distribution of the precursor gases G1, G2 may be localized at particular regions on the planar surfaces of the substrates 113. Additionally, the precursor gases G1, G2 may be separated from each other as much as possible before they are introduced into the MOCVD reactor 101 whilst ensuring that the precursor gases G1, G2 are both present when they are just above the planar surfaces of the substrates 113 to form the compound semiconductor. Advantageously, undesirable gas phase reactions between the precursor gases G1, G2 may be reduced as the precursor gases G1, G2 move toward the substrates 113 in the MOCVD reactor 101.

Although FIG. 1 shows that first precursor gas G1 is introduced into the MOCVD reactor 101 through the spinner 105 instead of through the gas distributor 103, it should nevertheless be appreciated that other ways of introducing the precursor gases and the purging gases G1-G3 into the MOCVD reactor 101 are also feasible. For instance, the second precursor gas G2 may be introduced into the MOCVD reactor 101 through the spinner 105, with the first precursor gas G1 and the purging gases G3 being introduced through the gas distributor 103. Alternatively, both the first and second precursor gases G1, G2 may be both introduced into the MOCVD reactor 101 through the spinner 105, with the purging gases G3 being solely introduced through the gas distributor 103. Yet another way involves introducing all the precursors and purging gases G1-G3 through the gas distributor 103 into the MOCVD reactor 101, with no gas being introduced through the spinner 105. In this particular instance, the spinner 105 may be a solid structure. In addition, the purging gases may not be needed if the gas distributor 103 introduces at least one of the first and second precursor gases G1, G2 into the MOCVD reactor 101.

Figure 2:
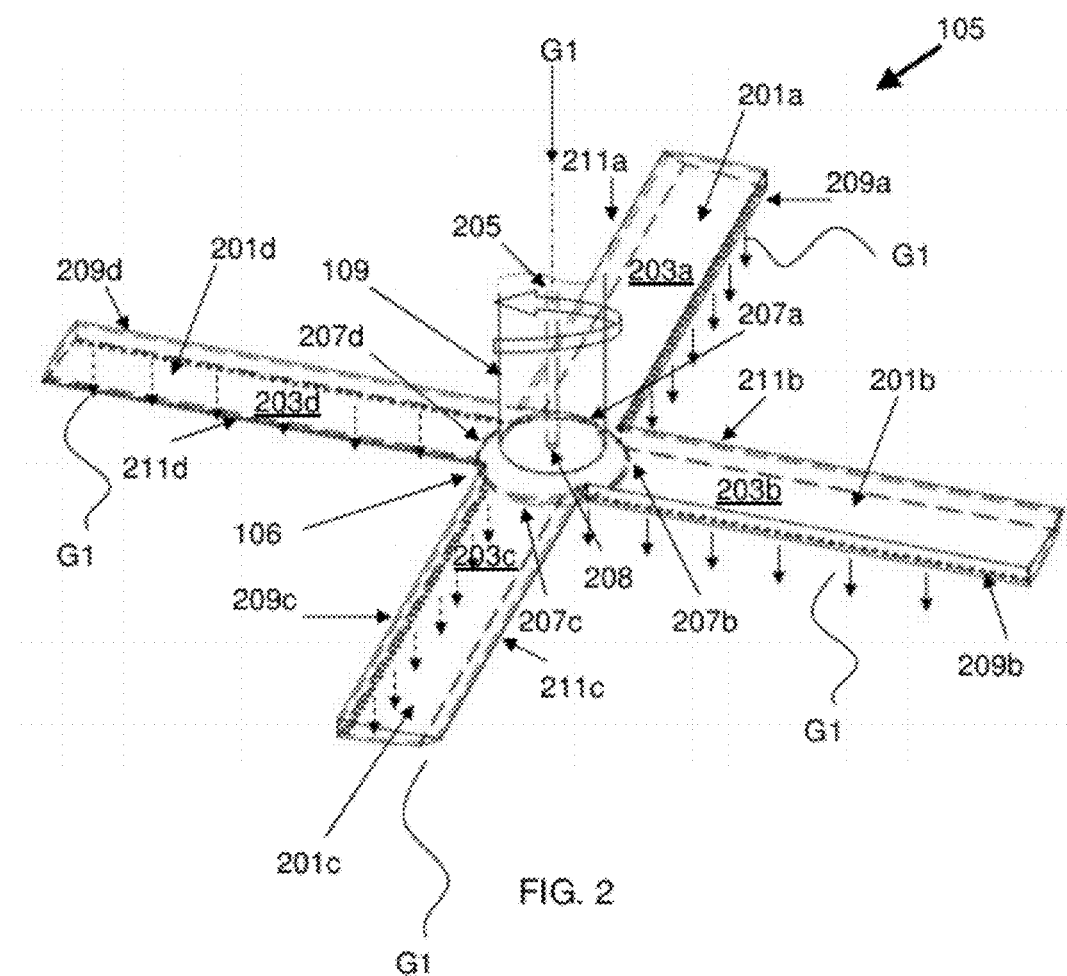
FIG. 2 is an isometric view of the first embodiment of the spinner when in use.

FIG. 2 is an isometric view of the spinner 105 when in use. The spinner 105 includes four elongate blades 201a-d connected to the hub 106. It can be seen from FIG. 2 that each of the elongate blades 201a-d defines a generally thin and flat structure. In particular, the blades 201a-d are mutually diverging and orthogonally spaced around the hub 106. The blades 201a-d also include respective blade channels 203a-d having inlets 207a-d through which a gas can be introduced and outlets 209a-d located at the base of the blades 201a-d through which the introduced gas can exit.

The feedthrough 109 also includes a gas channel 205 having an inlet through which a gas can be introduced from a gas supply and an outlet through which the introduced gas can exit. The exited gas from the feedthrough 109 then enters the hub 106 through a hub inlet 208. Since the hub 106 of the spinner 105 is generally hollow, there is thus a fluid communication through the gas channel 205 of the feedthrough 109, the hub 106, and the blade channels 203a-d of the blades 201a-d. This accordingly allows the first precursor gas G1 to flow unimpeded from the feedthrough 109 to the blades 201a-d through the hub 106 of the spinner 105, before being introduced into the MOCVD reactor 101.

From FIG. 2, it can also be seen that the thickness of the blades 201a-d generally decreases and tapers towards respective edge portions 211a-d to form corresponding wedge portions. However, it should be appreciated that it is merely preferable but not essential that each of the blades 201a-d include a corresponding wedge portion. Alternatively, an elongated structure having flat parallel faces may instead be used to construct each of the blades 201a-d.

The spinner 105 is configured to rotate on a plane in a circumferential direction around the hub 106, whereby the wedge portions 211a-d define leading edges of the blades 201a-d and their corresponding opposite edges define trailing edges of the blades 201a-d during rotation. Accordingly, the blades 201a-d of the spinner 105 are configured to rotate in an counterclockwise circumferential direction around the hub 106 when viewed from the top of the spinner 105 in FIG. 2.

Figure 3:
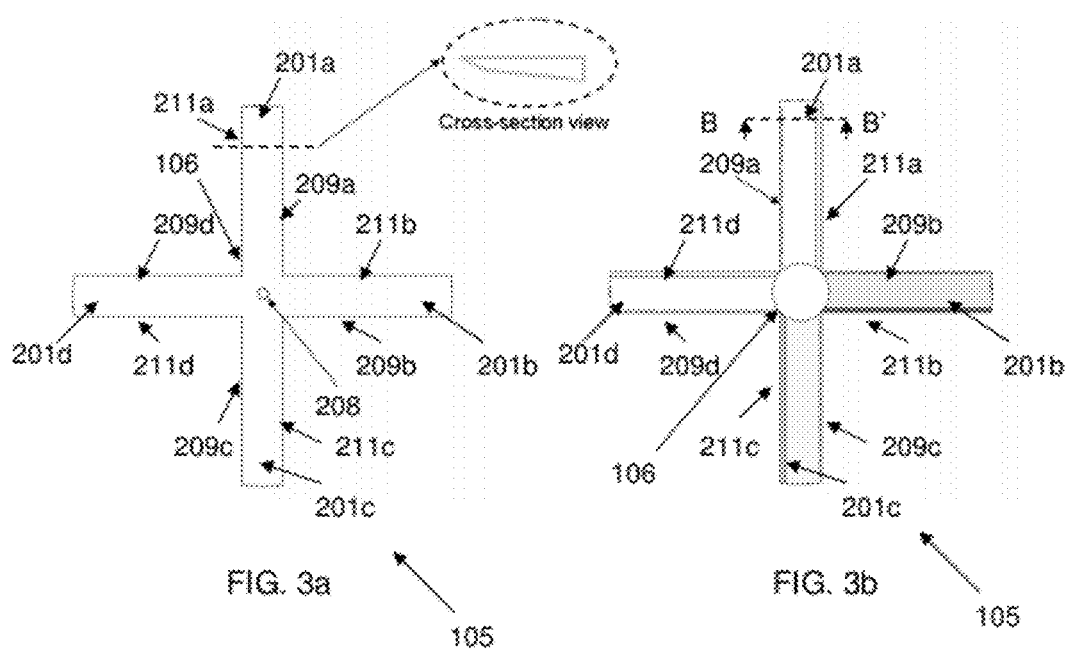
FIG. 3a and FIG. 3b are respective top and bottom views of the spinner of FIG. 2.

FIG. 3a and FIG. 3b are top and bottom views of the spinner 105 of FIG. 2 respectively. It can be seen from FIG. 3a that the hub 106 includes the hub inlet 208 for connecting with the gas channel 205 of the feedthrough 109 in such a way as to allow fluid communication. However, the underside of the hub 106 is completely sealed as shown in FIG. 3b so that the first precursor gas G1 flows from the hub 106 to each of the blades 201a-d of the spinner 105.

Figure 4:
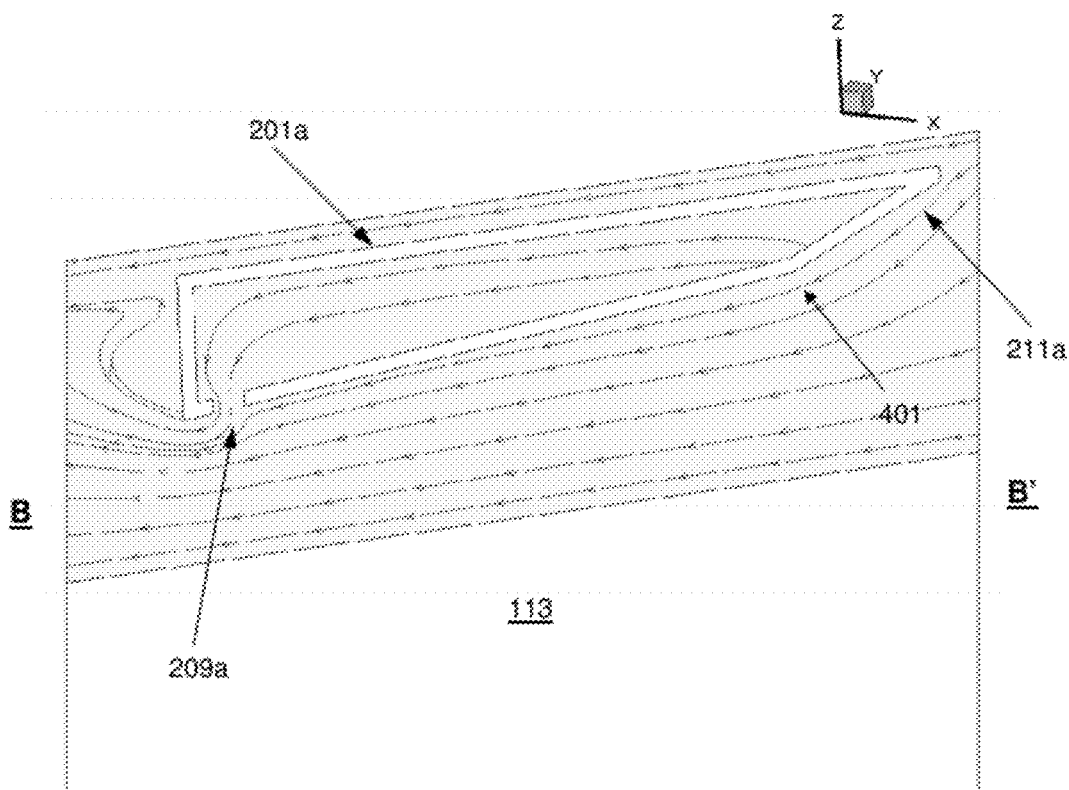
FIG. 4 is a cross-sectional view of a blade of the spinner of FIG. 2, when viewed along the line B-B' as indicated in FIG. 3b, and shows an air-flow around the blade.

FIG. 4 is a cross-sectional view of a particular blade 201a of the spinner 105 of FIG. 2 when viewed along line B-B' as indicated in FIG. 3b. It is seen that the underside of the blade 201a is inclined at an oblique angle to the plane on which the blade 201a rotates. Accordingly, the inclined underside of the blade 201a provides a driving force on the fluid gases during rotation, whereby the fluid gases are made to flow from the leading edge to the trailing edge of the blade 201a. A laminar fluid flow is therefore generated along the top and bottom surfaces of the blade 201a from the leading edge to the trailing edge as the blade 201a rotates. More specifically, the underside of the blade 201a is inclined at different angles to form a kink 401. This increases the corresponding volume of the blade channel 203a.

It should be appreciated that the other three blades 201b-d of the spinner 105 are also identical to the blade 201a shown in FIG. 4. Thus, laminar fluid flows are similarly generated along the top and bottom surfaces of these blades 201b-d from the respective leading edges to the trailing edges as they rotate.

Although the precursor gases G1, G2 and the purging gases G3 are introduced into the MOCVD reactor 101 in the downward direction that is generally perpendicular to the planar surfaces of the substrates 113 during operation, the driving forces provided by the structure of the blades 201a-d alter the flow direction of the precursor gases G1, G2 and the purging gases G3 to create a laminar gas flow next to the top and bottom surfaces of the blades 201a-d when the spinner 105 rotates. This ensures that the precursor gases G1, G2 meet to chemically react on top of the wafer surface, even though they are separated far from each other when they are introduced into the MOCVD reactor 101. By separating the precursor gases G1, G2 far from each other, any undesirable gas phase reaction between them may be significantly reduced. This advantageously improves the precursor efficiency and the quality of the compound semiconductor deposited on the substrate 113.

Figure 5:
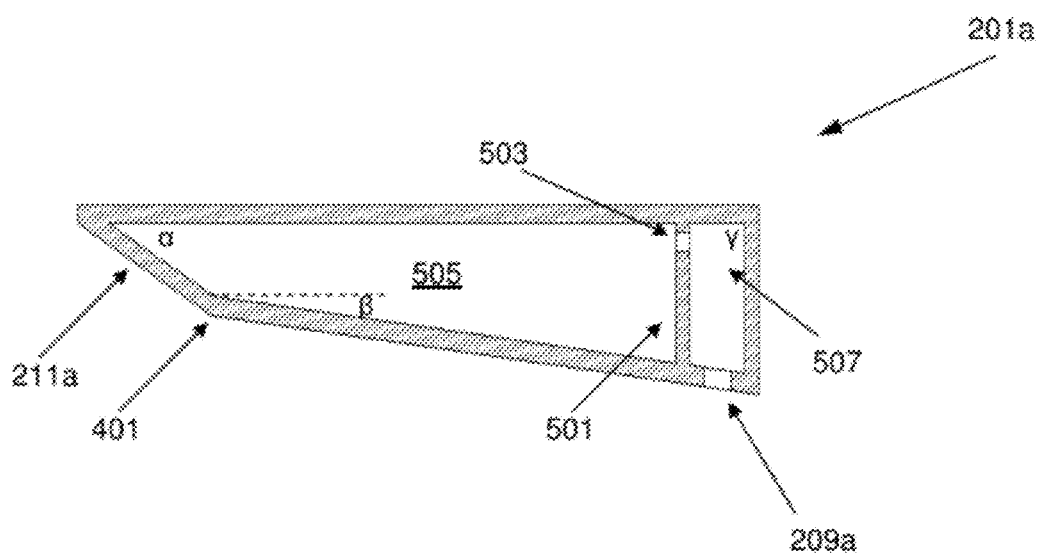
FIG. 5 shows a blade of the spinner of FIG. 2 including an inner partition.

Optionally, each of the blades 201a-d may include an inner partition. FIG. 5 shows a cross-sectional view of the blade 201a with an inner partition 501 arranged along a length of the blade 201a, which thereby divides the blade channel 203a into first and second compartments 505, 507. The inner partition 501 specifically includes a slit opening 503 along the length of the blade 201a through which the first precursor gas G1 can flow from the first compartment 505 to the second compartment 507, before the first precursor gas G1 subsequently exits the second compartment 507 from the outlet 209a into the MOCVD reactor 101.

Without the inner partition 501 in each of the blades 201a-d, most of the first precursor gas G1 may tend to be introduced into the MOCVD reactor 101 through the proximal ends of the blades 201a-d nearest to the hub 106 compared with their distal ends furthest from the hub 106. This consequently leads to an uneven distribution of the first precursor gas G1 in the MOCVD reactor 101 along each length of the blades 201a-d.

By providing the inner partition 501 in each of the blades 201a-d, the slit opening 503 which is significantly smaller than the outlet 209a-prevents most of the first precursor gas G1 from exiting the blades 201a-d through their proximal ends and ensures that a sufficient amount of the first precursor gas G1 exits through the distal ends of the blades 201a-d. This accordingly ensures a more even distribution of the first precursor G1 in the MOCVD reactor 101 along the length of the blades 201a-d.

Referring to FIG. 5, it is also seen that the surfaces of the blade 201a are inclined at respective angles α, β and γ with respect to the plane on which the blade 201a rotates. Preferably, that the range of α may be between 10-60°, the range of β between 5-45°, and the range of γ between 45-135°.

Figure 6:
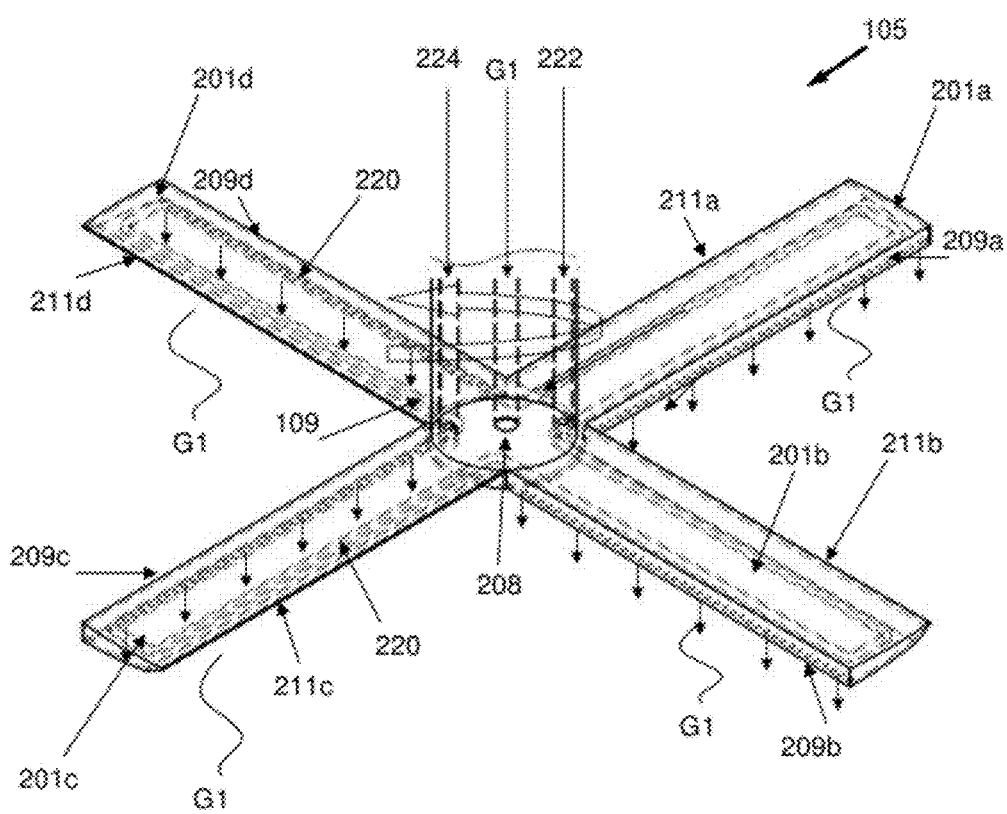
FIG. 6 shows the spinner of FIG. 2 including a water channel.

Optionally, the spinner 105 and the feedthrough 109 may further include a water channel 220 arranged within the interiors of the hub 106 and the blades 201a-d for cooling the spinner 105 during use, as shown in FIG. 6. The water channel 220 includes a water inlet 222 through which cooling water can be introduced into the water channel 220 from a water supply, and a water outlet 224 through which the cooling water can be discharged from the water channel 220 and returned to the water supply for re-cooling. Advantageously, the water channel 220 adapts the spinner 105 for compatibility in high-temperature MOCVD processes.

Figure 7:
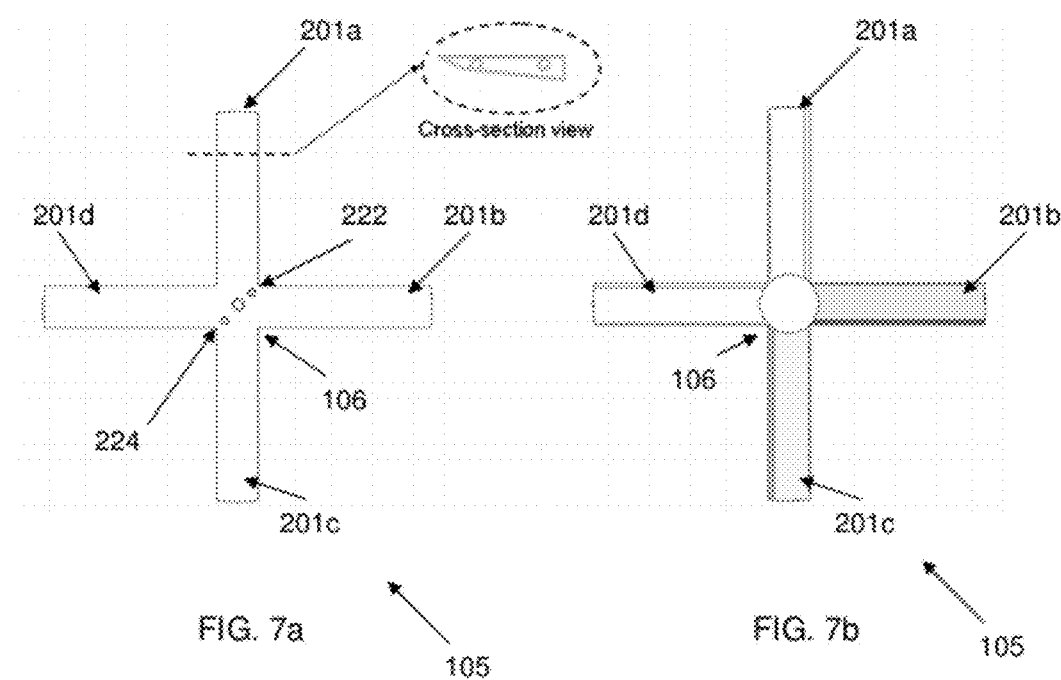
FIG. 7a and FIG. 7b are respective top and bottom views of the spinner of FIG. 6.

FIG. 7a and FIG. 7b are top and bottom views of the spinner 105 of FIG. 6 respectively. It can be seen from FIG. 7a that both the water inlet 222 and the water outlet 224 of the water channel 220 are positioned at the hub 106. Like the hub 106 of the spinner 105 without the water channel 220, the underside of the hub 106 is completely sealed as seen from FIG. 7b so that the first precursor gas G1 flows from the hub 106 to each of the blades 201a-d of the spinner 105.

Figure 8:
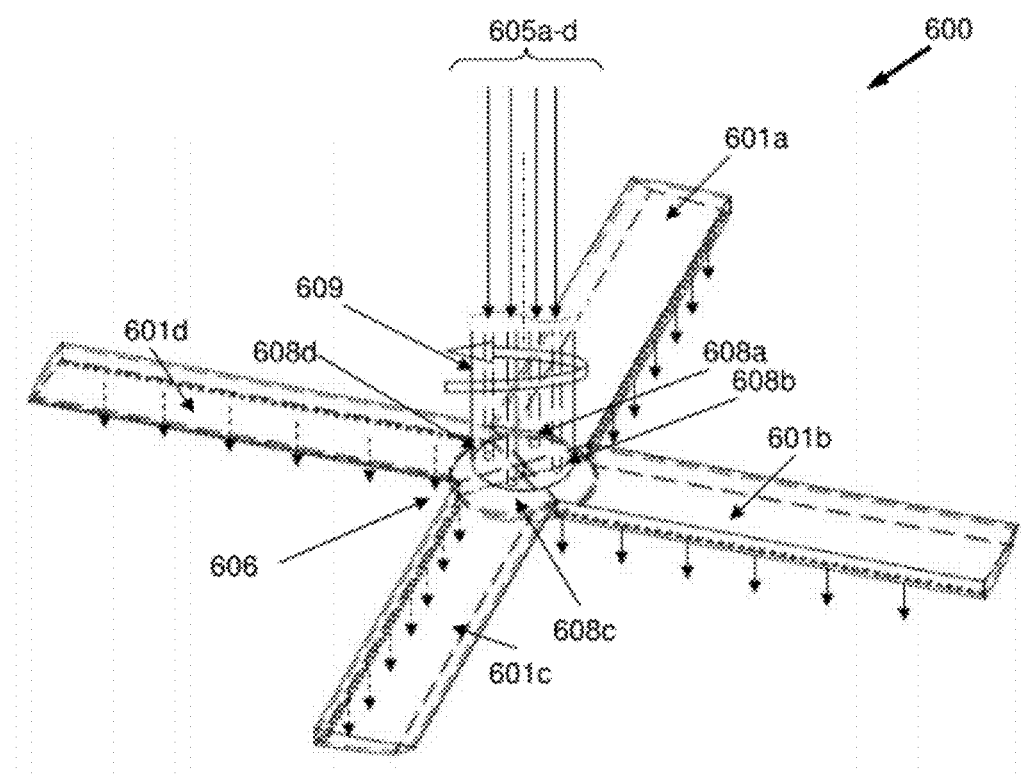
FIG. 8 is an isometric view of a spinner according to a second embodiment of the invention.

FIG. 8 shows a spinner 600 according to a second embodiment of the invention. The spinner 600 is largely similar to the spinner 105 of the first embodiment. For instance, the spinner 600 includes a hub 606 for operative connection to a motor. The spinner 600 also includes four elongate blades 601a-d connected to the hub 606, which are mutually diverging and angularly spaced orthogonally around the hub 606. The blades 601a-d also include respective edge portions defining wedge portions, and the blades 601a-d are configured to rotate such that these wedge portions form corresponding leading edges.

However, the hub 606 of the spinner 600 in the second embodiment comprises four hub inlets 608a-d for fluid communication with respective gas channels 605a-d of a similar feedthrough 609, instead of comprising just a single hub inlet 208 in the case of the spinner 105 according to the first embodiment. Moreover, there is no fluid communication among different blade channels of the blades 601a-d. Thus, the feedthrough 609 may be connected to different gas supplies for supplying different fluid gases into the MOCVD reactor 101. For instance, both the first and second precursor gases G1, G2 may be introduced into the MOCVD reactor 101 through adjacent blades 601a-d of the spinner 600. Alternatively, the precursor gases G1, G2, and the purging gases G3 may all be introduced into the MOCVD reactor 101 through the blades 601a-d of the spinner 600.

FIG. 9a and FIG. 9b are respective top and bottom views of the spinner 600 of FIG. 8. It is seen from FIG. 9a that the hub 606 includes the respective hub inlets 608a-d for connecting with the corresponding gas channels 605a-d of the feedthrough 609 in such a way as to allow fluid communication. Like the hub 106 of the spinner 105 according to the first embodiment, the underside of the hub 606 is completely sealed as seen from FIG. 9b so that the precursor gases G1, G2 and/or the purging gases G3 flow from the hub 606 to each of the blades 601a-d of the spinner 600.

Of course, it should be appreciated that the feedthrough 609 may be connected to a single gas supply that supplies any one of the precursor gases G1, G2 and the purging gases G3 to the MOCVD reactor 101.

Figures 10A, 10B:
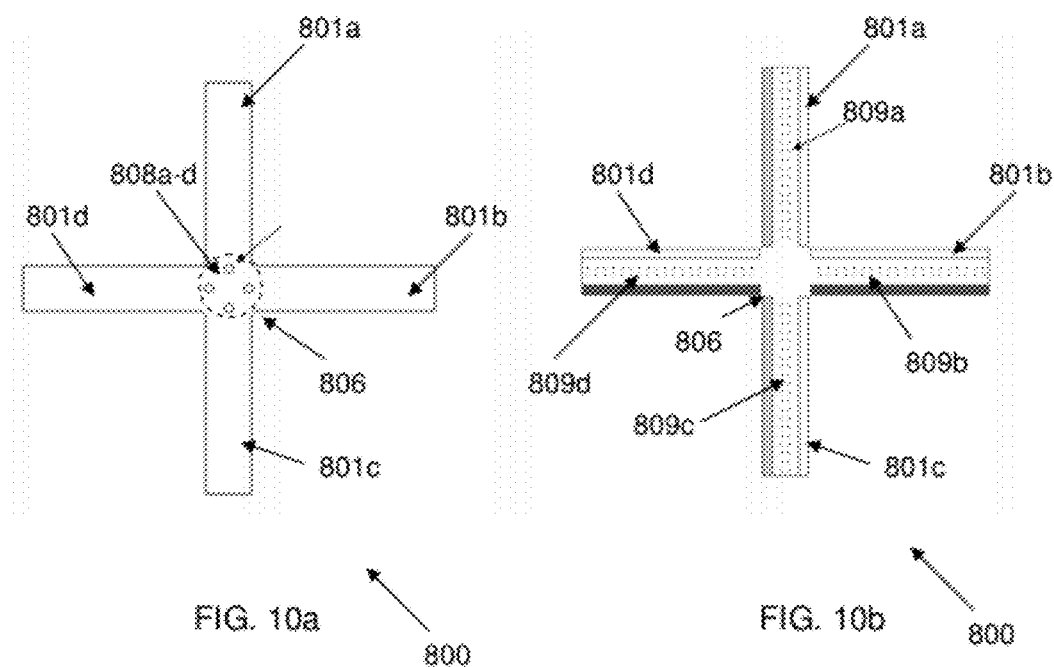
FIG. 10a and FIG. 10b are respective top and bottom views of a spinner according to a third embodiment of the invention.

FIG. 10a and FIG. 10b are respective top and bottom views of a spinner 800 according to a third embodiment of the invention. The spinner 800 of the third embodiment is also largely similar to the spinner 105, 600 of the first and second embodiments. For instance, the spinner 800 includes four elongate blades 801 a-d connected to a hub 806. In particular, the blades 801 a-d are mutually diverging and orthogonally spaced angularly around the hub 806 about which the blades 801a-d rotate. The blades 801 a-d also include blade channels with respective outlets 809a-d at the base of the blades 801 a-d through which any introduced gas can exit.

In contrast with the spinners 105, 600 of the first and second embodiments, it can be seen from FIG. 10b that the respective outlets 809a-d of the blades 801a-d are arranged mid-way between the leading and trailing edges of the blades 801a-d as they rotate, instead of being arranged at the trailing edges of the blades 801a-d as in the spinners 105, 600 according to the first and second embodiments. Furthermore, two parallel rows of outlets are provided between the respective leading and trailing edges of the blades 801a-d.

Figure 11:
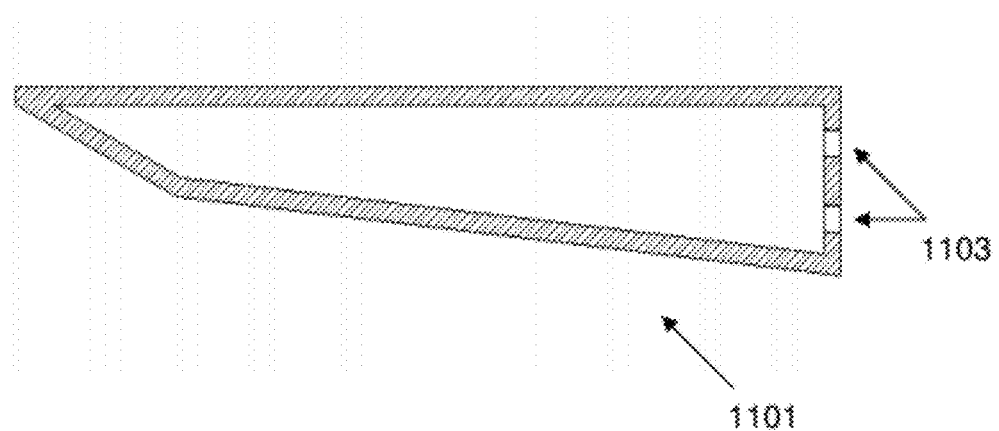
FIG. 11 shows a different configuration of a blade of the spinner of FIG. 2.

FIG. 11 shows a different configuration of a blade 1101 of the spinner 105. The blade 1101 is similar to the previous blade 201a as earlier described, except in respect of its outlets 1103 through which the precursor gas or the purging gas can flow into the MOCVD reactor 101. In the configuration of the previous blade 201a, the outlet 209a is located at the base of the blade 201a. Thus, the precursor gas or purging gas can be directed towards the substrate surface. In contrast with the previous blade 201a, however, the outlets 1103 of the blade 1101 are arranged at its side. Accordingly, the precursor gas or the purging gas is discharged in a direction that is generally parallel to the substrate surface. Such a configuration of the blade may thereby reduce fluid disturbance when the MOCVD reactor 101 is in use, compared with that of the previous blade 201a.

Figure 12:
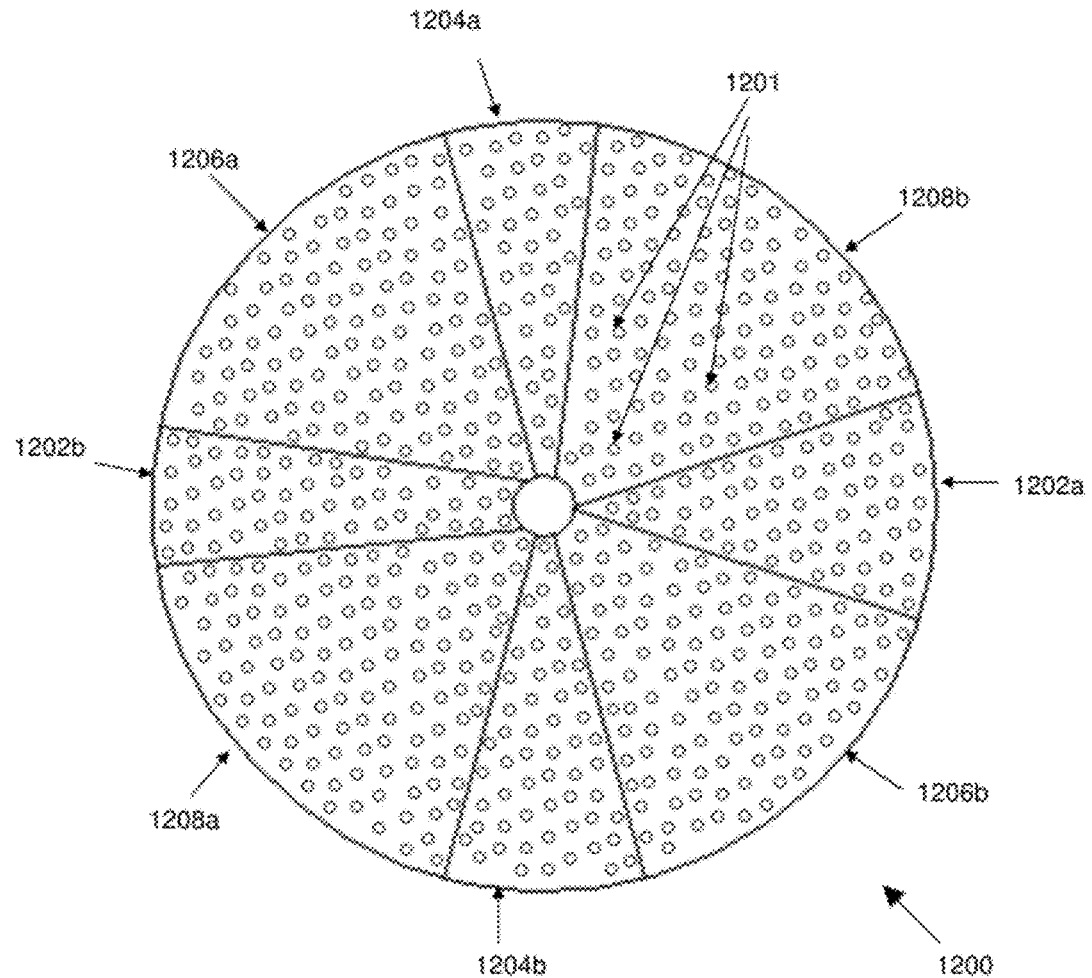
FIG. 12 shows a gas distributor according to the first embodiment of the invention.

FIG. 12 shows a plan view of an embodiment of a gas distributor 1200, which is usable in the MOCVD reactor 101. The gas distributor 1200 is configured to direct the precursor gases G1, G2 and/or the purging gases G3 towards the substrate surface in the MOCVD reactor 101. In particular, the interior of the gas distributor 1200 is partitioned into various sets of compartments 1202a-b, 1204a-b, 1206a-b, 1208a-b with seals provided between different sets of the compartments 1202a-b, 1204a-b, 1206a-b, 1208a-b to prevent mutual fluid communication. In addition, the gas distributor 1200 has apertures 1201 which are evenly distributed at the base of the compartments 1202a-b, 1204a-b, 1206a-b, 1208a-b through which the fluid gases can pass through.

However, the interior of the gas distributor 1200 is not partitioned evenly, and therefore, the compartments 1202a-b, 1204a-b, 1206a-b, 1208a-b have different internal volumes. In particular, the gas distributor 1200 is partitioned in such a way that the compartments 1202a, 1204a, 1206a, 1208a have a larger concentration of apertures 1201 at their outer edges compared with the adjacent compartments 1202b, 1204b, 1206b, 1208b. The compartments 1202a, 1204a, 1206a, 1208a also have a smaller concentration of apertures 1201 at their centres compared with the adjacent compartments 1202b, 1204b, 1206b, 1208b.

In use, the various sets of compartments 1202a-b, 1204a-b, 1206a-b, 1208a-b are connected to separate gas supplies to receive various fluid gases. Specifically, the compartments 1202a-b receive the first precursor gas G1, the compartments 1204a-b receive the second precursor gas G2, and the compartments 1206a-b, 1208a-b receive the purging gases G3. More specifically, two separate sets of gas supplies are provided—a first set for supplying the first and second precursor gases G1, G2 and the purging gases G3 to the compartments 1202a, 1204a, 1206a and 1208a respectively, and a second set for supplying the first and second precursor gases G1, G2 and the purging gases G3 to the compartments 1202b, 1204b, 1206b and 1208b respectively.

If the thickness of the film deposited on the substrate 113 is thicker at its centre than at its outer edge, the flow rate of the gas supply connected to the compartment 1202a—which receives the first precursor gas G1—may be increased relative to the flow rate of the gas supply connected to the corresponding compartment 1202b. This is because the deposit growth of the semiconductor component on the substrate 113 is most sensitive to the distribution of the first precursor gas G1 in the MOCVD reactor 101. Since the compartment 1202a has a larger concentration of apertures 1201 at its outer edge compared with the corresponding compartment 1202b, the gas distributor 1200 is thus able to compensate for the non-uniformity of the thickness of the deposited film on the substrate 113.

However, if the thickness of the deposited film is thicker at the outer edge than at the centre of the substrate 113, the flow rate of the gas supply connected to the compartment 1202bmay be increased relative to the flow rate of the gas supply connected to the compartment 1202a. Since the compartment 1202b has a larger concentration of apertures 1201 at its centre compared with the corresponding compartment 1202a, the gas distributor 1200 is thus able to compensate for the non-uniformity of the thickness of the deposited film on the substrate 113.

It should be appreciated that the flow rates of each of the first and second set of gas supplies connected to the compartments 1202a-b, 1204a-b, 1206a-b, 1208a-b may be appropriately adjusted so that the gas distributor 1200 better ensures the uniformity of the thickness of the deposited substrate film, and advantageously improves the quality of the deposited film on the substrate.

Figure 13:
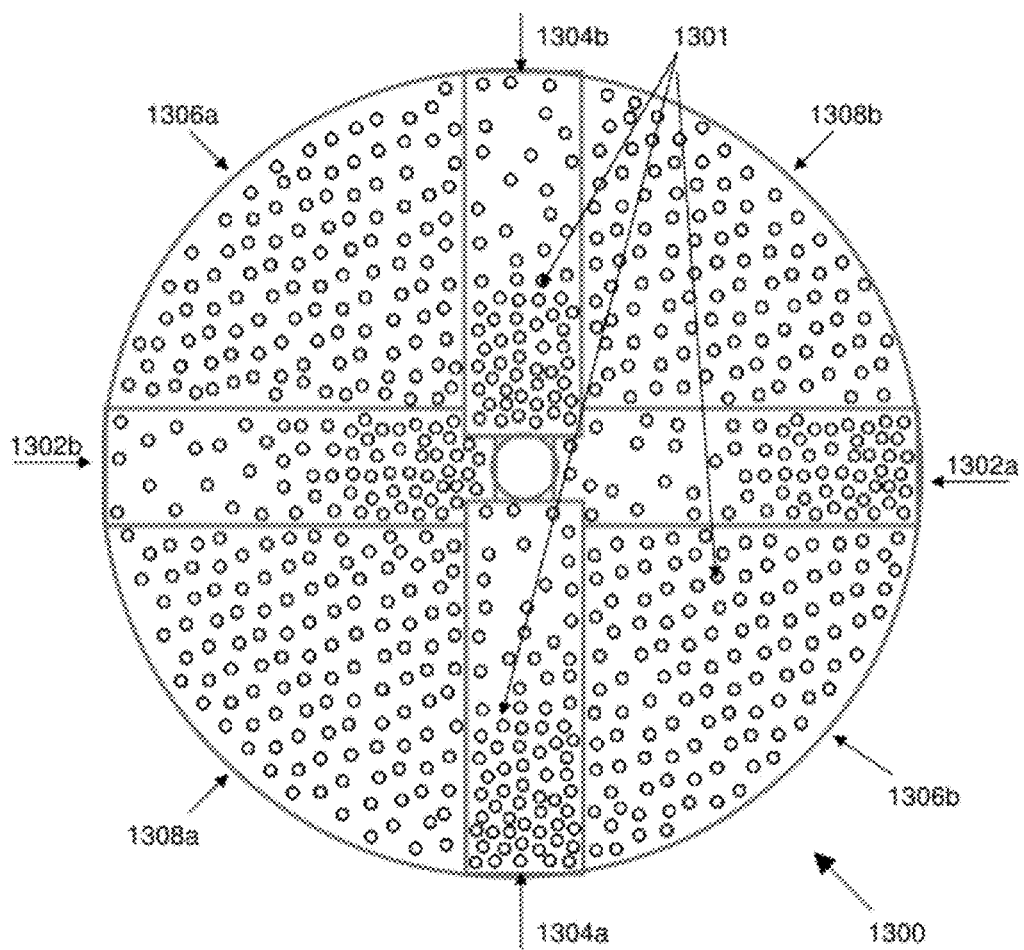
FIG. 13 shows a gas distributor according to the second embodiment of the invention.

FIG. 13 shows another gas distributor 1300 according to a second embodiment. Like the previous gas distributor 1200, the interior of the gas distributor 1200 is partitioned into various sets of compartments 1302a-b, 1304a-b, 1306a-b, 1308a-b with seals provided between different sets of the compartments 1302a-b, 1304a-b, 1306a-b, 1308a-b to prevent fluid communication.

In use, the various sets of compartments 1302a-b, 1304a-b, 1306a-b, 1308a-b are connected to separate gas supplies to receive various gases. Specifically, the compartments 1302*a-b* receive the first precursor gas G1, the compartments 1304*a-b* receive the second precursor gas G2, and the compartments 1306*a-b*, 1308*a-b* receive the purging gases G3. More specifically, two separate sets of gas supplies are provided—a first set for supplying the first and second precursor gases G1, G2 and the purging gases G3 to the compartments 1302*a*, 1304*a*, 1306*a* and 1308*a* respectively, and a second set for supplying the first and second precursor gases G1, G2 and the purging gases G3 to the compartments 1302*b*, 1304*b*, 1306*b* and 1308*b* respectively.

However, unlike the previous gas distributor 1200, the compartments 1302*a-b*, 1304*a-b* of the present gas distributor 1300 have the same internal volume. The compartments 1306*a-b* and the compartments 1308*a-b* also have the same volume. Moreover, the apertures 1301 at the base of each of the compartments 1302*a-b*, 1304*a-b* are not evenly distributed. Instead, there is a higher concentration of apertures 1301 at the outer edges of the compartments 1302*a*, 1304*a* compared with the outer edges of the corresponding compartments 1302*b*, 1304*b*. There is also a higher concentration of apertures 1301 at the centres of the compartments 1302*b*, 1304*b* compared with the centres of the corresponding compartments 1302*a*, 1304*a*.

If the thickness of the deposited film is thicker at its centre than at its outer edge, the flow rate of the gas supply connected to the compartment 1302*a* may be increased relative to the flow rate of the gas supply connected to the compartment 1302*b*. Since the compartment 1302*a* has a larger concentration of apertures 1301 at its outer edge compared with the corresponding compartment 1302*b*, the gas distributor 1300 is thus able to compensate for the non-uniformity of the thickness of the deposited film on the substrate 113.

However, if the thickness of the deposited film is thicker at its outer edge than at its centre, the flow rate of the gas supply connected to the compartment 1302*b* may be increased relative to the flow rate of the gas supply connected to the compartment 1302*a*. Since the compartment 1302*b* has a larger concentration of apertures 1301 at its centre compared with the corresponding compartment 1302*a* the gas distributor 1300 is thus able to compensate for the non-uniformity of the thickness of the deposited film on the substrate 113.

It should be appreciated that each of the flow rates of the first and second set of gas supplies connected to the compartments 1302*a-b*, 1304*a-b*, 1306*a-b*, 1308*a-b* may be appropriately controlled so that the gas distributor 1300 better ensures the uniformity of the thickness of the deposited substrate film, and advantageously improves the quality of the deposited film.

Figure 14:
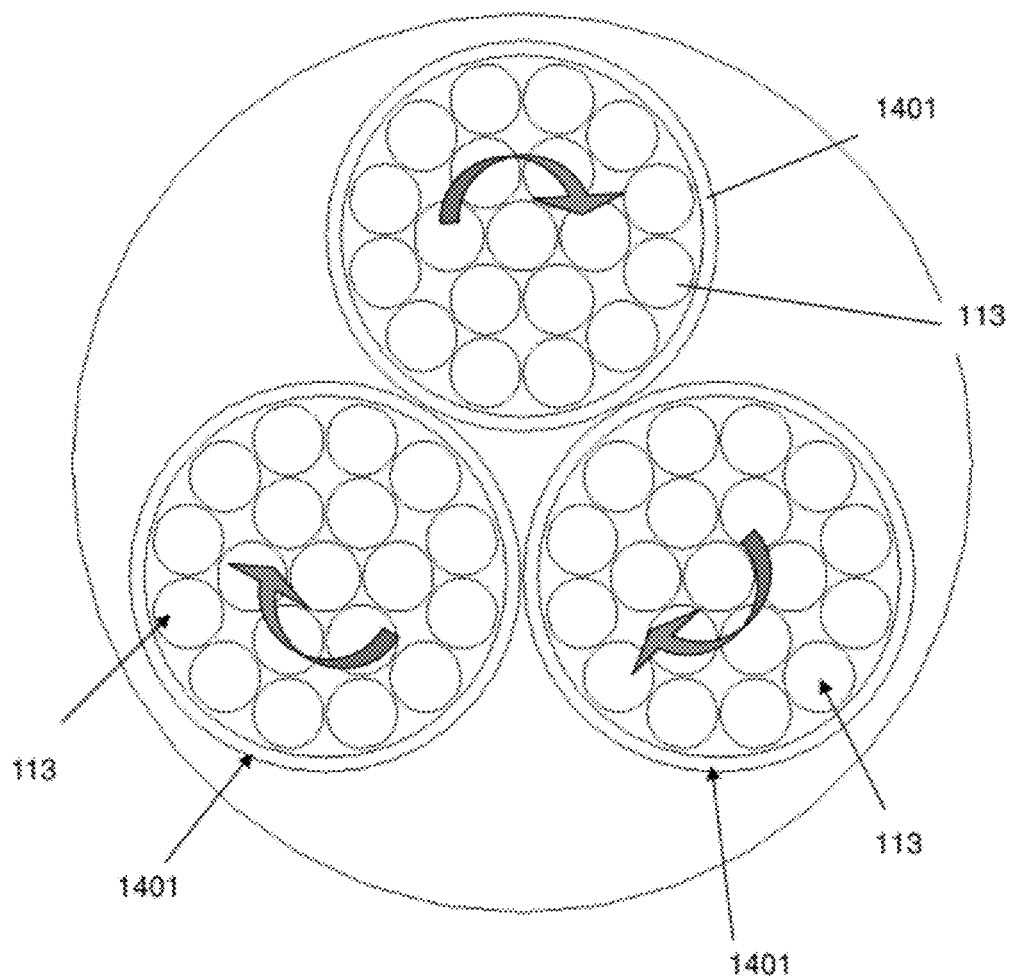
FIG. 14 shows susceptors for use in the MOCVD reactor of FIG. 1 to support substrates.

FIG. 14 shows the three susceptors 1401 that are usable in the MOCVD reactor 101 of FIG. 1. Each susceptor 1401 carries a number of substrates 113 and rotates when in use. By rotating the susceptors 1401, any difference in the thickness of the film deposited on the substrates 113 can be reduced, thereby improving the uniformity of the thickness of the deposited film. This further improves the quality of the deposited film on the substrates 113.

It should be appreciated that other variations of the components of the MOCVD reactor 101 may be included without departing from the scope and spirit of this invention. For instance, although it has been described that each of the embodiments of the spinner has four mutually divergent blades that are angularly spaced orthogonally around the spinner hub, other embodiments of the spinner may instead either just have a single blade, or they may have any number of blades. In addition, although GaN has been described as the thin-film material deposited on the surfaces of the substrates 113, other material forming the Group III/V compound group such as Gallium Arsenide (GaAs) or those forming the Group II/VI compound group such as Zinc Oxide (ZnO) may also be used. Furthermore, different embodiments of the spinner and the gas distributor herein described may also be used in other deposition techniques such as chemical vapour deposition (CVD), atomic layer deposition (ALD), and hydride vapour phase epitaxy (HVPE).

The invention claimed is:

1. An apparatus for depositing a thin film onto a surface of a substrate using precursor gases, the apparatus comprising:
   a supporting device configured to hold the substrate; and
   a spinner positioned adjacent to the supporting device, the spinner having:
      a hub for connecting to a motor; and
      one or more blades connected to the hub,
   wherein the one or more blades are operative to rotate around the hub on a plane to drive a fluid flow of the precursor gases, so as to distribute the precursor gases across the surface of the substrate; and
   each of the one or more blades has a drive face inclined at an oblique angle to the plane for driving the distribution of the precursor gases across the surface of the substrate.

2. The apparatus of claim 1, wherein the drive face is inclined at different angles to form a kink.

3. An apparatus for depositing a thin film onto a surface of a substrate using precursor gases, the apparatus comprising:
   a supporting device configured to hold the substrate; and
   a spinner positioned adjacent to the supporting device, the spinner having:
      a hub for connecting to a motor; and
      one or more blades connected to the hub,
   wherein the one or more blades are operative to rotate around the hub on a plane to drive a fluid flow of the precursor gases, so as to distribute the precursor gases across the surface of the substrate; and
   each of the one or more blades is an airfoil.

4. The apparatus of claim 1, wherein
   the hub comprises a hub inlet through which one of the precursor gases is introduced into an interior of the hub, and
   each of the one or more blades comprises a blade outlet through which the precursor gas is dispensed from an interior of the respective blade,
   the interiors of the hub and the blade being in mutual fluid communication.

5. The apparatus of claim 4, wherein the hub comprises a plurality of the hub inlets configured to receive one or more of the precursor gases.

6. The apparatus of claim 4, wherein the blade outlet is arranged at a trailing edge of the respective blade away from a direction of rotation of that respective blade.

7. The apparatus of claim 4, further comprising an inner partition arranged along a length of the interior of each of the one or more blades, wherein the inner partition defines an opening through which the corresponding precursor gas flows before being dispensed from the interior of the respective blade.

8. The apparatus of claim 4, further comprising a water channel arranged within the interior of the hub as well as the interior of each of the one or more blades, the water channel being for cooling the spinner when in use, and having a water inlet for receiving water from a water supply and a water outlet for discharging the water.

9. The apparatus of claim 1, further comprising a gas distributor positioned adjacent to the spinner.

10. The apparatus of claim 9, wherein the gas distributor is configured to direct one or more purging gases to the surface of the substrate.

11. The apparatus of claim 3, wherein
the hub comprises a hub inlet through which one of the precursor gases is introduced into an interior of the hub, and
each of the one or more blades comprises a blade outlet through which the precursor gas is dispensed from an interior of the respective blade,
the interiors of the hub and the blade being in mutual fluid communication.

12. The apparatus of claim 11, wherein the blade outlet is arranged at a trailing edge of the respective blade away from a direction of rotation of that respective blade.

13. The apparatus of claim 3, further comprising a gas distributor positioned adjacent to the spinner.

14. The apparatus of claim 13, wherein the gas distributor is configured to direct one or more purging gases to the surface of the substrate.

\* \* \* \* \*